(12) United States Patent
Shinohara et al.

(10) Patent No.: US 12,142,512 B2
(45) Date of Patent: Nov. 12, 2024

(54) VACUUM APPARATUS

(71) Applicant: NUFLARE TECHNOLOGY, INC., Yokohama (JP)

(72) Inventors: Yoshiaki Shinohara, Hiratsuka (JP); Michihiro Kawaguchi, Mishima (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 345 days.

(21) Appl. No.: 17/651,283

(22) Filed: Feb. 16, 2022

(65) Prior Publication Data

US 2022/0172922 A1    Jun. 2, 2022

Related U.S. Application Data

(63) Continuation of application No. PCT/JP2020/029722, filed on Aug. 3, 2020.

(30) Foreign Application Priority Data

Aug. 21, 2019   (JP) .................................. 2019-151411

(51) Int. Cl.
 *H01L 21/687* (2006.01)
 *H01L 21/677* (2006.01)
 (Continued)

(52) U.S. Cl.
 CPC .. *H01L 21/68707* (2013.01); *H01L 21/67742* (2013.01); *H01L 21/67748* (2013.01);
 (Continued)

(58) Field of Classification Search
 CPC .............. B25J 11/0095; G03F 7/70733; G03F 7/70875; H01J 2237/2001;
 (Continued)

(56) References Cited

U.S. PATENT DOCUMENTS 5,489,192 A     2/1996 Taniguchi
6,794,662 B1 *  9/2004 Leavitt .............. H01L 21/68707
                                         250/442.11
(Continued)

FOREIGN PATENT DOCUMENTS

JP      06-204316 A    7/1994
JP      07-147311 A    6/1995
(Continued)

OTHER PUBLICATIONS

Machine translation of KR-2001010975-A (Year: 2001).*
(Continued)

*Primary Examiner* — James Keenan
(74) *Attorney, Agent, or Firm* — Oblon, McClelland, Maier & Neustadt, L.L.P.

(57) ABSTRACT

A vacuum apparatus includes: a chamber; and a transfer robot transferring a processing object into the chamber, wherein the transfer robot includes an arm portion, a support portion provided at a tip of the arm portion and having a lower thermal conductivity than the arm portion, a plate provided between the support portion and the processing object and having a higher thermal conductivity than the support portion, and a support pad provided on the support portion and supporting the processing object by being in contact with the processing object while separating the processing object from the plate, a contact region allowing the support portion and the plate to be in contact with each other therein and a space region separated the support portion and the plate from each other are provided between the support portion and the plate, and the plate includes a projection configured as the contact region.

10 Claims, 6 Drawing Sheets

(51) Int. Cl.
    *G03F 7/00*     (2006.01)
    *H01J 37/18*    (2006.01)
    *H01J 37/20*    (2006.01)
    *H01J 37/317*   (2006.01)

(52) U.S. Cl.
    CPC .... *H01L 21/68757* (2013.01); *G03F 7/70733* (2013.01); *H01J 37/185* (2013.01); *H01J 37/20* (2013.01); *H01J 37/3174* (2013.01); *H01J 2237/2001* (2013.01); *H01J 2237/204* (2013.01)

(58) Field of Classification Search
    CPC ......... H01J 2237/204; H01L 21/67742; H01L 21/67748; H01L 21/68707; H01L 21/68757
    See application file for complete search history.

(56) References Cited

U.S. PATENT DOCUMENTS

| | | |
|---|---|---|
| 8,987,683 B2 | 3/2015 | Kawaguchi et al. |
| 9,387,584 B2 | 7/2016 | Yazawa et al. |
| 11,427,929 B2 * | 8/2022 | Yu .......................... C23C 16/44 |
| 2007/0159615 A1 | 7/2007 | Horiuchi |
| 2012/0034570 A1 | 2/2012 | Yasui et al. |

FOREIGN PATENT DOCUMENTS

| | | |
|---|---|---|
| JP | 2004-304032 A | 10/2004 |
| JP | 2007-048984 A | 2/2007 |
| JP | WO2007/080779 A1 | 7/2007 |
| JP | 4005938 B2 | 11/2007 |
| JP | 2008-166623 A | 7/2008 |
| JP | 2009-141091 A | 6/2009 |
| JP | 2010-064231 A | 3/2010 |
| JP | 2010-157630 A | 7/2010 |
| JP | 2012-054536 A | 3/2012 |
| JP | 5420892 B2 | 2/2014 |
| JP | 2014-216528 A | 11/2014 |
| JP | 6151080 B2 | 6/2017 |
| JP | 2018-078265 A | 5/2018 |
| KR | 20010100975 A * | 11/2001 ....... H01L 21/67742 |
| WO | WO 2013/073379 A1 | 5/2013 |

OTHER PUBLICATIONS

Combined Chinese Office Action and Search Report issued on Jul. 10, 2023 in Chinese Patent Application No. 202080053171.4 (with unedited computer-generated English translation of Office Action only), 17 pages.

International Search Report issued Sep. 24, 2020 in PCT/JP2020/029722 filed on Aug. 3, 2020, 2 pages.

Taiwanese Office Action issued May 31, 2021 in Taiwan Application No. 109127135, 12 pages (with English Machine Translation).

Japanese Office Action issued Mar. 7, 2023 in Japanese Patent Application No. 2019-151411 (with unedited computer-generated English Translation), 7 pages.

* cited by examiner

VACUUM APPARATUS

CROSS REFERENCE TO RELATED APPLICATIONS

This application is based upon and claims the benefit of priority from the prior Japanese Patent Application No. 2019-151411, filed on Aug. 21, 2019 and International Patent Application No. PCT/JP2020/029722, filed on Aug. 3, 2020, the entire contents of which are incorporated herein by reference.

FIELD

The embodiments of the present invention relate to a vacuum apparatus.

BACKGROUND

In a charged particle beam drawing apparatus, a transfer robot carries a mask into a vacuum chamber and places it on a drawing stage in order to draw a pattern on the mask. The mask receives heat from the transfer robot because of contact with the transfer robot until the mask is placed on the stage. The heat of the transfer robot is conducted to the mask through a robot arm and is therefore conducted only to a portion where the mask and a pad of the transfer robot are in contact with each other. Accordingly, temperature variation is generated in a plane of the mask, making thermal expansion of the mask non-uniform. This non-uniform thermal expansion leads to deterioration of the drawing accuracy.

SUMMARY

A vacuum apparatus includes: a chamber of which internal pressure is reduced; and a transfer robot configured to transfer a processing object into the chamber, wherein the transfer robot includes an arm portion, a support portion provided at a tip of the arm portion and having a lower thermal conductivity than the arm portion, a plate provided between the support portion and the processing object and having a higher thermal conductivity than the support portion, and a support pad provided on the support portion and configured to support the processing object by being in contact with the processing object while separating the processing object from the plate, a contact region configured to allow the support portion and the plate to be in contact with each other therein and a space region configured to separate the support portion and the plate from each other are provided between the support portion and the plate, and the plate includes a projection configured as the contact region.

DETAILED DESCRIPTION

Figure 1:
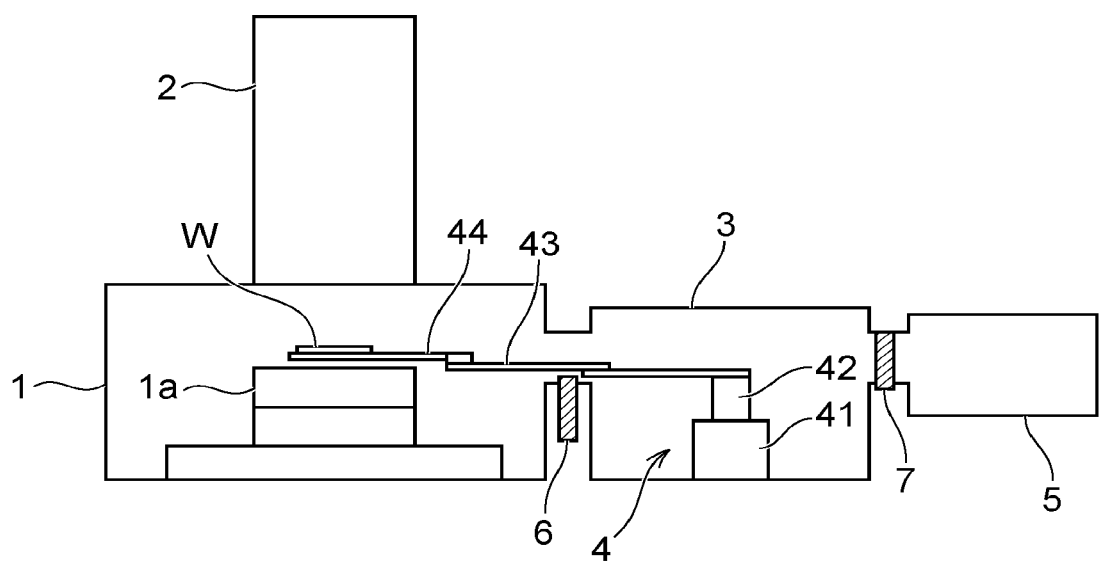
FIG. 1 is a diagram illustrating a configuration example of a charged particle beam drawing apparatus according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

First Embodiment

FIG. 1 is a diagram illustrating a configuration example of a charged particle beam drawing apparatus 10 according to a first embodiment. The charged particle beam drawing apparatus 10 illustrated in FIG. 1 radiates an electron beam onto a processing object (a mask W), for example, to draw a predetermined pattern. The present embodiment may be an apparatus that radiates an electron beam or light onto a processing object, for example, an exposure apparatus, an electron microscope, or an optical microscope, other than the drawing apparatus. Therefore, the processing object may be an object other than the mask, for example, a semiconductor substrate. A charged particle beam may be, for example, an electron beam, a light beam, or an ion beam.

The charged particle beam drawing apparatus 10 as a vacuum apparatus includes a drawing chamber 1, an electron lens barrel 2, a robot chamber 3, a transfer robot 4, and a load lock chamber 5.

The drawing chamber 1 is evacuated to reduce internal pressure thereof and accommodates therein a drawing stage 1a on which a mask (mask blanks) W is placed. The electron lens barrel 2 includes an electron gun, an aperture array, and the like (not illustrated) and radiates an electron beam (a charged particle beam) onto the mask W on the drawing stage 1a. The robot chamber 3 is arranged between the drawing chamber 1 and the load lock chamber 5 and is evacuated. The robot chamber 3 accommodates therein the transfer robot 4 and is used for transferring the mask W between the drawing chamber 1 and the load lock chamber 5. The transfer robot 4 is configured to be rotatable about a rotation mechanism 41 in the robot chamber 3 and transfers the mask W by a lifting rod 42, a robot arm 43, and an end effector 44. The load lock chamber 5 is used for transferring the mask W between outside and the robot chamber 3. The load lock chamber 5 is exposed to the atmosphere when transferring the mask W thereinto from outside, and is evacuated as with the robot chamber 3 when transferring the mask W to the robot chamber 3. Gate valves 6 and 7 are provided between the drawing chamber 1 and the robot chamber 3 and between the robot chamber 3 and the load lock chamber 5, respectively.

Figure 2:
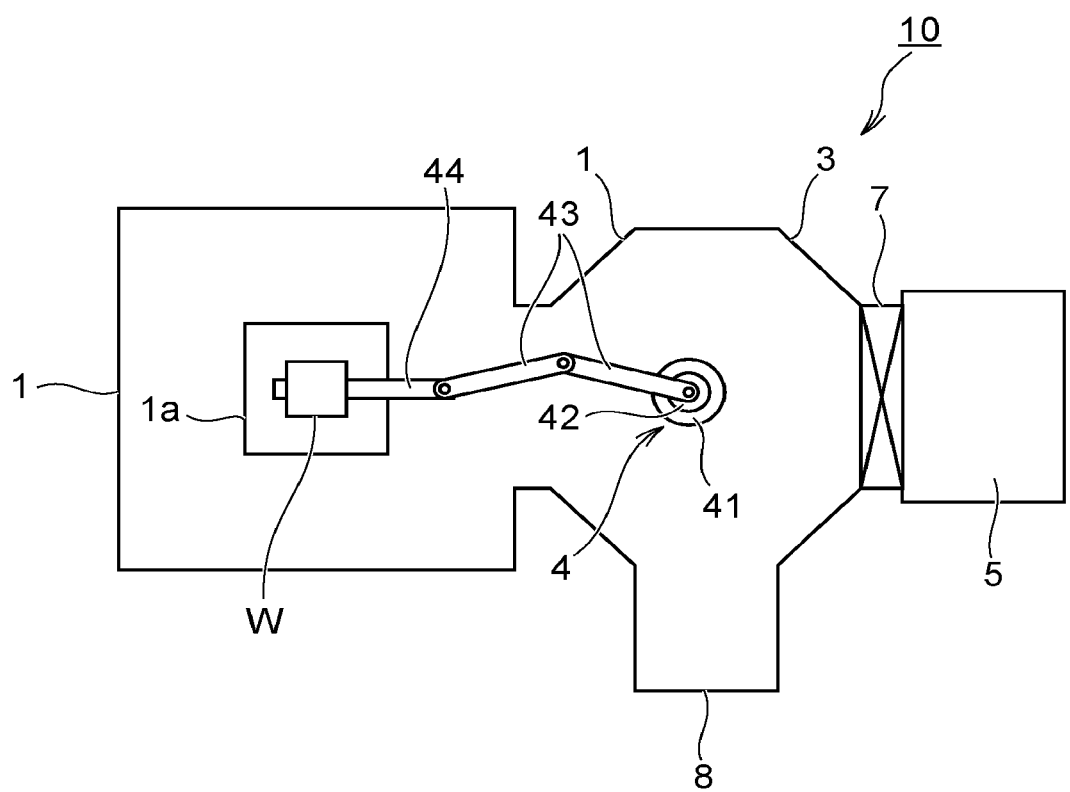
FIG. 2 is a diagram illustrating a configuration example of the charged particle beam drawing apparatus.

FIG. 2 is a diagram illustrating a configuration example of the charged particle beam drawing apparatus 10. The transfer robot 4 is accommodated in the robot chamber 3, includes the end effector 44 that holds the mask W, and transfers the mask W. The transfer robot 4 includes the rotation mechanism 41, the lifting rod 42, the robot arm 43, and the end effector 44. The rotation mechanism 41 can rotate the robot arm 43 and the end effector 44 about a substantially vertical axis. The lifting rod 42 can move the robot arm 43 and the end effector 44 up and down in the rotation mechanism 41. The robot arm 43 is attached to the lifting rod 42, and transfers the mask W by bending and stretching a plurality of shafts while holding the mask W. The rotation mechanism 41 incorporates a driving source for causing the rotation mechanism 41, the lifting rod 42, and the robot arm 43 to operate. The end effector 44 is provided at a tip of the robot arm 43 and is configured to be able to hold the mask W. A more detailed configuration of the transfer robot 4 will be described later with reference to FIG. 3. An alignment chamber 8 that positions the mask W is provided around the robot chamber 3.

Because of heat generation of the driving source of the transfer robot 4 (for example, Joule heat by passing electricity through the driving source), heat from the driving source is conducted to the end effector 44 through the robot arm 43 to increase the temperature of the end effector 44 in some cases. For example, when the mask W is placed on the end effector 44 and transferred to the drawing stage 1a, the temperature of the mask W may be increased by about 0.04° C. to 0.05° C. by thermal conduction from the end effector 44. In a case of drawing a fine pattern such as an LSI pattern, even this slight temperature increase may adversely affect the drawing accuracy. Further, temperature variation is generated in the mask W, and thermal expansion of the mask W becomes non-uniform, so that the drawing accuracy may be deteriorated.

Drawing on the mask W is normally performed after waiting until the temperature of the mask W placed on the drawing stage 1a becomes approximately equal to the temperature of the drawing stage 1a. However, in a vacuum in the drawing chamber 1, there is substantially no heat transfer by convection of a medium and it is therefore hard for the heat of the mask W to be exhausted. Therefore, a waiting time (a soaking time) until the temperature of the mask W becomes the temperature of the drawing stage 1a is quite long. Further, the robot chamber 3 is provided with a soaking chamber for making the temperature of the mask W uniform in some cases, although not illustrated. However, soaking heat treatment is performed also in the soaking chamber in a non-contact manner, and the soaking time is also relatively long. Therefore, when temperature variation is generated in the mask W by thermal conduction from the end effector 44, the time of subsequent soaking becomes long.

Accordingly, a transfer robot according to the present embodiment has the following configuration.

Figure 3A:
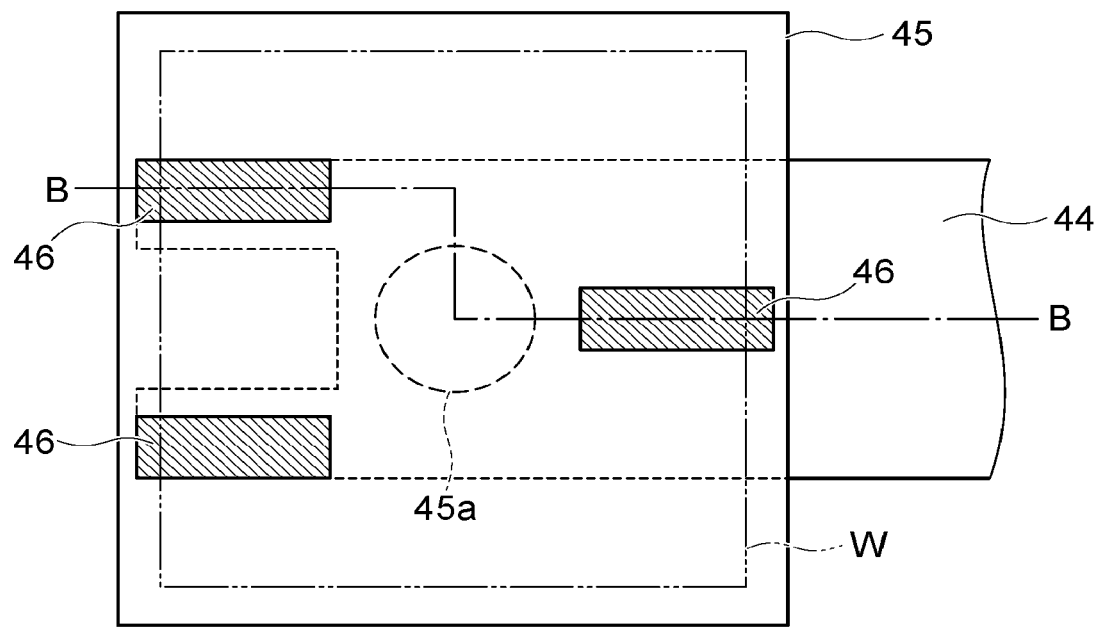
FIG. 3A and FIG. 3B are respectively a plan view and a side view illustrating a configuration example of a tip of the transfer robot according to the first embodiment.
Figure 3B:
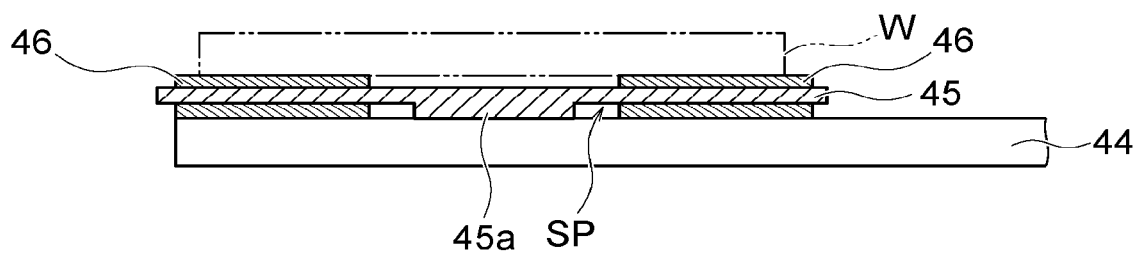

FIG. 3A and FIG. 3B are respectively a plan view and a side view illustrating a configuration example of a tip of the transfer robot 4 according to the first embodiment. FIG. 3B illustrates a cross-section taken along a line B-B in FIG. 3A.

The transfer robot 4 includes the end effector 44, a plate 45, and a support pad 46. The end effector 44 as a support portion is provided at the tip of the robot arm 43 as an arm portion and is made of a material having a lower thermal conductivity than the robot arm 43. Metal having a relatively high thermal conductivity such as stainless or aluminum alloy is used for the robot arm 43. A material having a relatively low thermal conductivity, for example, a ceramic material such as zirconia, engineering plastic such as PEEK (PolyEtherEtherKetone) is used for the end effector 44. Accordingly, heat generated in the rotation mechanism 41 or the lifting rod 42 is transferred through the robot arm 43 but is hardly conducted to the end effector 44.

When the end effector 44 is charged, it can easily adsorb particles or a failure caused by discharge can easily occur. In order to handle these problems, the end effector 44 is preferably coated with an electrically conductive thin film material to prevent charging by an electron beam.

However, although the thermal conductivity of the end effector 44 is low, the temperature of the end effector 44 is high near a portion where the end effector 44 and the robot arm 43 are connected to each other. On the other hand, the tip of the end effector 44, which is away from the robot arm 43, is substantially insulated thermally and the temperature of the tip remains low. Therefore, in-plane temperature distribution (temperature variation) is generated also in the end effector 44. When there is in-plane temperature variation in the end effector 44, it is likely that temperature variation is generated also in a plane of the mask W because of radiation from the end effector 44.

Accordingly, the plate 45 is provided between the end effector 44 and the mask W. The plate 45 is made of a material having a higher thermal conductivity than the end effector 44. Further, the plate 45 is made of a material having a lower emissivity than the mask W. In a case where the mask W is made of quartz, for example, a metal material having a high thermal conductivity and a low emissivity, for example, copper, aluminum, or gold is used for the plate 45.

As illustrated in FIG. 3A, the plate 45 has a larger area than the mask W in a plane. The outer edge of the plate 45 is located outside the outer edge of the mask W as viewed in the vertical direction, and the plate 45 is overlapped by the mask W. Further, as illustrated in FIG. 3B, the plate 45 is arranged substantially in parallel to the mask W and the surface of the end effector 44 and is not in direct contact with the mask W. Meanwhile, the plate 45 has a projection 45a and is in contact with the end effector 44 via the projection 45a. The projection 45a is made of the same material as the plate 45.

As described above, the plate 45 having a high thermal conductivity is provided between the end effector 44 and the mask W and is brought into contact with the end effector 44. Accordingly, heat of the end effector 44 is transferred to the plate 45 and is made substantially uniform in a plane of the plate 45. That is, in-plane temperature distribution (variation) of the end effector 44 is made uniform by the plate 45. Further, the emissivity of the plate 45 is lower than that of the mask W. Therefore, the mask W is not much affected by thermal radiation from the plate 45. Even if the mask W is affected by thermal radiation from the plate 45 to some extent, the mask W is affected by the temperature that has been made substantially uniform by the plate 45. In addition, the outer edge of the plate 45 is located outside the outer edge of the mask W as viewed in the vertical direction, and the plate 45 is larger than the mask W. Therefore, the plate 45 can shield the entire mask W from radiation from the end effector 44. Accordingly, the mask W is hardly affected by in-plane temperature distribution (variation) of the end effector 44. Consequently, the temperature of the mask W is not much varied in its plane and can be kept substantially uniform. Note that the emissivity of copper is increased when copper is oxidized. However, since the plate 45 is moved in a vacuum, the plate 45 is not oxidized even when copper is used for the plate 45, and the emissivity can be kept low.

In addition, as illustrated in FIG. 3A, the support pad 46 supports the mask W by being in contact therewith at three points in a plane of the mask W, thereby allowing the mask W to be held on the end effector 44. As illustrated in FIG. 3B, the support pad 46 is provided above the end effector 44 and is made of a material having a lower thermal conductivity than the robot arm 43 and the plate 45. A material having a low thermal conductivity, for example, resin or a ceramic material is used for the support pad 46. The thermal conductivity of the support pad 46 is lower than that of the robot arm 43. The support pad 46 is provided between the end effector 44 and the plate 45 and between the plate 45 and the mask W and supports the plate 45 and the mask W. In other words, the plate 45 is interposed in the support pad 46 between the end effector 44 and the mask W and separates the entire mask W from the end effector 44. Accordingly, the plate 45 can separate the mask W from radiant heat of the end effector 44 to some extent and can relax in-plane temperature distribution.

The projection 45*a* as a contact region and a space region SP are provided between the plate 45 and the end effector 44. The projection 45*a* serves as the contact region that allows the end effector 44 and the plate 45 to be in contact with each other therein as described above. The space region SP is a region that separates the end effector 44 and the plate 45 from each other.

If the space region SP is not provided and the entire plate 45 is in contact with the end effector 44, the plate 45 transfers the temperature distribution of the end effector 44 as it is and cannot make the temperature uniform.

On the other hand, in the present embodiment, both the projection 45*a* as the contact region and the space region SP are provided between the plate 45 and the end effector 44. Therefore, the projection 45*a* transfers the temperature of the end effector 44 in the contact region to the plate 45. Meanwhile, the space region SP separates the plate 45 from the end effector 44 and does not conduct heat from the end effector 44 to the plate 45. Accordingly, the plate 45 can transfer heat only in the contact region into a plane of the plate 45 through the projection 45*a* to make in-plane temperature distribution of the plate 45 substantially uniform. In addition, the plate 45 itself is made of a material having a relatively low emissivity. Therefore, the mask W is hardly affected by radiation from the plate 45, and temperature variation in a plane of the mask W is not large.

Figure 4:
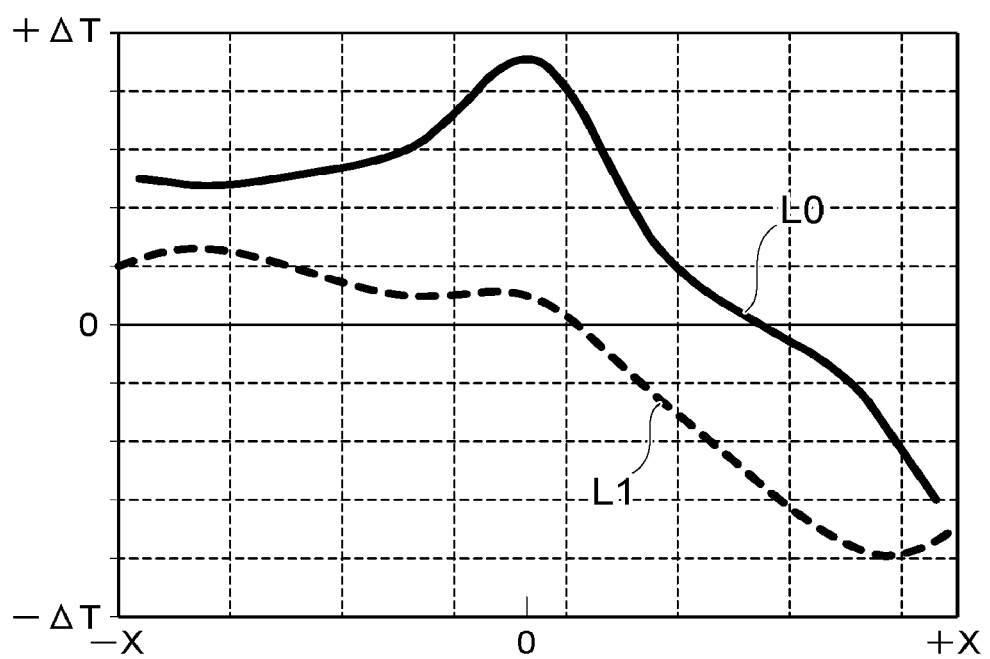
FIG. 4 is a graph representing a temperature change of the mask placed on the stage from the transfer robot.

FIG. 4 is a graph representing a temperature change of the mask W placed on the stage 1*a* from the transfer robot 4. The horizontal axis represents the position in the mask W, where 0 represents the center of the mask W. The vertical axis represents a temperature change of the mask W, where 0 represents that the temperature is not changed. A temperature change to the positive (+ΔT) side means increase of the temperature of the mask W when the mask W is placed on the stage 1*a*. A temperature change to the negative (−ΔT) side means decrease of the temperature of the mask W when the mask W is placed on the stage 1*a*. That is, it is preferable that the temperature change in a plane of the mask W is close to 0.

A line L0 represents a temperature change of the mask W in a case where the end effector 44 is made of the same metal material as the robot arm 43 and the plate 45 is not provided. In this case, the temperature change has a large peak toward the +ΔT side near the center of the mask W and is reduced toward the −ΔT side at +X. Therefore, temperature variation in a plane of the mask W is large.

A line L1 represents a temperature change of the mask W in a case where the transfer robot 4 according to the present embodiment is used. That is, the end effector 44 is made of a material having a low thermal conductivity, for example, a ceramic material, and the plate 45 is provided. In this case, although the temperature change is reduced toward the −ΔT side at +X, there is no peak as compared with the line L0, and temperature variation in a plane of the mask W is relatively small. As described above, the transfer robot 4 according to the present embodiment can reduce temperature variation in a plane of the mask W. Accordingly, it is possible to prevent deformation of the mask W during drawing and to prevent deterioration of the drawing accuracy.

The shapes of the end effector 44, the plate 45, and the support pad 46 are not limited to those in FIGS. 3A and 3B and may be changed as described in the following embodiments.

Second Embodiment

Figure 5A:
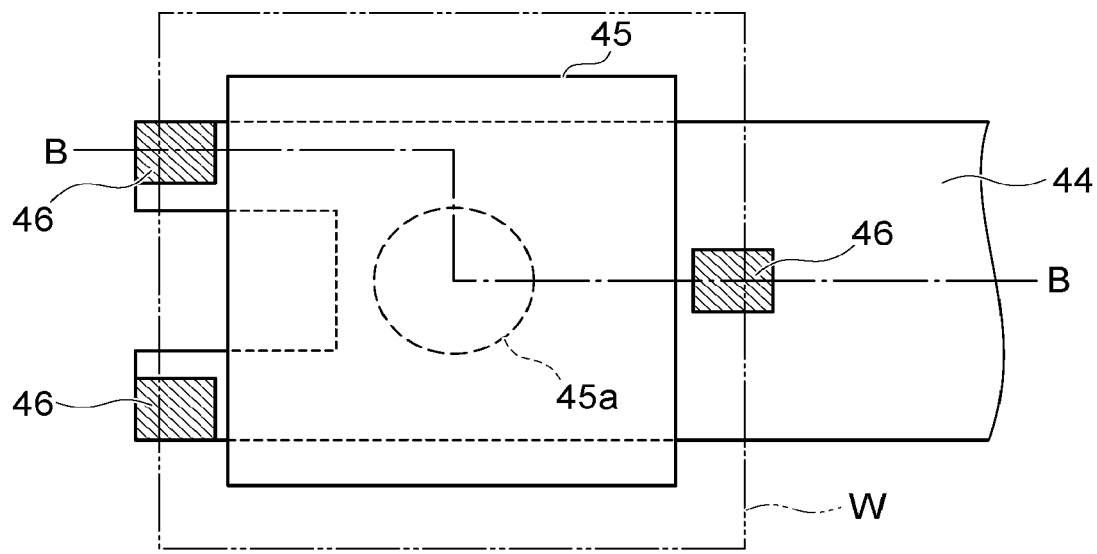
FIG. 5A and FIG. 5B are respectively a plan view and a side view illustrating a configuration example of a tip of the transfer robot according to a second embodiment.
Figure 5B:
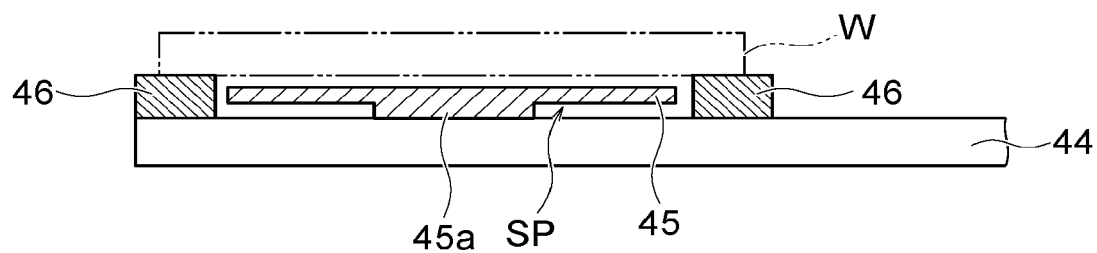

FIG. 5A and FIG. 5B are respectively a plan view and a side view illustrating a configuration example of a tip of the transfer robot 4 according to a second embodiment. In the second embodiment, the plate 45 is smaller than the mask W as viewed in the vertical direction. That is, the outer edge of the plate 45 is located inside the outer edge of the mask W as viewed in the vertical direction. The plate 45 is not in contact with the support pad 46 and is separated therefrom. Other configurations of the second embodiment may be identical to corresponding configurations of the first embodiment.

Even when the plate 45 is smaller than the mask W and is not in contact with the support pad 46 in this manner, the plate 45 can transfer heat from the end effector 44 into a plane of the plate 45 through the projection 45*a* substantially uniformly. Further, since the emissivity of the plate 45 is relatively low, the temperature of the mask W is hardly affected by radiant heat from the end effector 44 and is not much varied in a plane of the mask W.

According to the second embodiment, although the plate 45 is not provided under the entire mask W, the plate 45 can reduce in-plane temperature variation of the mask W to some extent.

Third Embodiment

Figure 6:
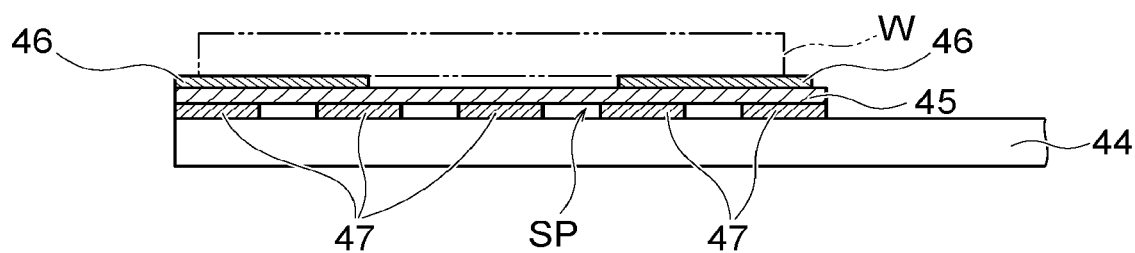
FIG. 6 is a side view illustrating a configuration example of a tip of the transfer robot according to a third embodiment.

FIG. 6 is a side view illustrating a configuration example of a tip of the transfer robot 4 according to a third embodiment. It suffices that a plan view in the third embodiment is the same as FIG. 3A. A plurality of legs 47 are provided in the third embodiment. The space region SP is provided between the legs 47 adjacent to each other. The support pad 46 is provided between the plate 45 and the mask W but is not provided between the plate 45 and the end effector 44. The legs 47 are made of a material having a lower thermal conductivity than the plate 45, support the plate 45, and separate the plate 45 from the end effector 44. Other configurations of the third embodiment may be identical to corresponding configurations of the first embodiment.

As described above, the plate 45 can receive radiant heat from the end effector 44 through the legs 47 and can transfer the heat into a plane of the plate 45 substantially uniformly. Since the thermal conductivity of the legs 47 is low, heat of the end effector 44 is not much transferred to the plate 45 through the legs 47. Further, since the emissivity of the plate 45 is relatively low, the temperature of the mask W is hardly affected by radiant heat from the end effector 44 and is not much varied in a plane of the mask W. Therefore, the third embodiment can obtain effects identical to those in the first embodiment.

Fourth Embodiment

Figure 7:
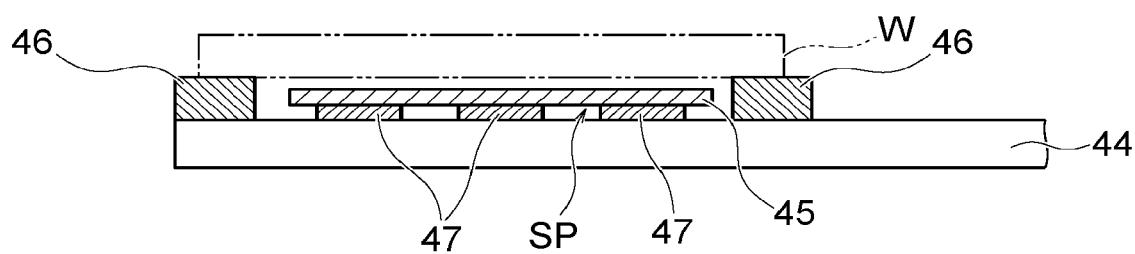
FIG. 7 is a side view illustrating a configuration example of a tip of the transfer robot according to a fourth embodiment.

FIG. 7 is a side view illustrating a configuration example of a tip of the transfer robot 4 according to a fourth embodiment. It suffices that a plan view in the fourth embodiment is the same as FIG. 5A. The fourth embodiment is a combination of the second and third embodiments. That is, the plate 45 is smaller than the mask W as viewed in the vertical direction. In addition, the legs 47 are provided under the plate 45. The space region SP is provided between the legs 47 adjacent to each other. Other configurations of the fourth embodiment may be identical to corresponding configurations of the second embodiment. Therefore, the fourth embodiment can obtain effects identical to those in the second and third embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A vacuum apparatus comprising:
a chamber of which internal pressure is reduced;
a transfer robot configured to transfer a processing object into the chamber; and
a driving source driving the transfer robot, wherein
the transfer robot includes
an arm portion to which heat generated from the driving source is transferred,
a support portion provided at a tip of the arm portion and having a lower thermal conductivity than the arm portion,
a plate provided between the support portion and the processing object and having a higher thermal conductivity than the support portion, and
a support pad provided on the support portion and configured to support the processing object by being in contact with the processing object while separating the processing object from the plate,
a contact region configured to allow the support portion and the plate to be in contact with each other therein and a space region configured to separate the support portion and the plate from each other are provided between the support portion and the plate, and
the plate contacts the support portion in the contact region and has a projection with a higher thermal conductivity than the support portion.

2. The apparatus of claim 1, wherein an emissivity of the plate is lower than that of the processing object.

3. The apparatus of claim 1, wherein
a ceramic material is used for the support portion,
copper, aluminum, or gold is used for the plate, and
resin is used for the support pad.

4. The apparatus of claim 1, wherein an outer edge of the plate is located outside an outer edge of the processing object as viewed in a substantially vertical direction.

5. The apparatus of claim 1, wherein an outer edge of the plate is located inside an outer edge of the processing object as viewed in a substantially vertical direction.

6. The apparatus of claim 1, wherein the plate and the processing object are arranged substantially in parallel to each other.

7. The apparatus of claim 1, wherein the plate and the support portion are arranged substantially in parallel to each other.

8. The apparatus of claim 1, wherein a surface of the support portion is coated with an electrically conductive material.

9. The apparatus of claim 1, wherein a thermal conductivity of the support pad is lower than that of the arm portion.

10. A vacuum apparatus, comprising:
a chamber of which internal pressure is reduced; and
a transfer robot configured to transfer a processing object into the chamber, wherein
the transfer robot includes
an arm portion,
a support portion provided at a tip of the arm portion and having a lower thermal conductivity than the arm portion,
a plate provided between the support portion and the processing object and having a higher thermal conductivity than the support portion, and
a support pad provided on the support portion and configured to support the processing object by being in contact with the processing object while separating the processing object from the plate,
a contact region configured to allow the support portion and the plate to be in contact with each other therein and a space region configured to separate the support portion and the plate from each other are provided between the support portion and the plate,
the plate includes a projection configured as the contact region, and
the plate is interposed in the support pad between the support portion and the processing object.

* * * * *